(12) United States Patent
Chuang et al.

(10) Patent No.: US 7,903,450 B2
(45) Date of Patent: *Mar. 8, 2011

(54) ASYMMETRICAL MEMORY CELLS AND MEMORIES USING THE CELLS

(75) Inventors: Ching-Te Chuang, South Salem, NY (US); Jae-Joon Kim, Yorktown Heights, NY (US); Keunwoo Kim, Somers, NY (US)

(73) Assignee: International Business Machines Corporation, Armonk, NY (US)

( * ) Notice: Subject to any disclaimer, the term of this patent is extended or adjusted under 35 U.S.C. 154(b) by 339 days.

This patent is subject to a terminal disclaimer.

(21) Appl. No.: 12/040,966

(22) Filed: Mar. 3, 2008

(65) Prior Publication Data

US 2008/0144362 A1     Jun. 19, 2008

Related U.S. Application Data

(63) Continuation of application No. 11/392,071, filed on Mar. 29, 2006, now Pat. No. 7,362,606.

(51) Int. Cl.
*G11C 11/00* (2006.01)
(52) U.S. Cl. .......................... 365/154; 365/155; 365/156
(58) Field of Classification Search .................. 365/154, 365/155, 156
See application file for complete search history.

(56) References Cited

U.S. PATENT DOCUMENTS

| | | | |
|---|---|---|---|
| 5,673,230 A | 9/1997 | Kuriyama | 365/203 |
| 5,986,924 A | 11/1999 | Yamada | |
| 6,198,656 B1 | 3/2001 | Zhang | 365/154 |
| 6,205,049 B1 | 3/2001 | Lien et al. | 365/154 |
| 6,573,549 B1 | 6/2003 | Deng et al. | |
| 6,831,483 B2 | 12/2004 | Shimazaki et al. | |
| 7,177,177 B2 | 2/2007 | Chuang et al. | 365/154 |
| 7,200,030 B2 | 4/2007 | Yamaoka et al. | |
| 7,362,606 B2 * | 4/2008 | Chuang et al. | 365/154 |
| 7,609,542 B2 * | 10/2009 | Adams et al. | 365/154 |
| 7,626,855 B2 * | 12/2009 | Kodama et al. | 365/156 |
| 7,710,765 B2 * | 5/2010 | Hanafi | 365/156 |

OTHER PUBLICATIONS

Chuang et al., U.S. Appl. No. 11/362,612, filed Feb. 27, 2006.
Chuang et al., U.S. Appl. No. 11/362,613, filed Feb. 27, 2006.
Azizi et al, "Low-Leakage Asymmetric-Cell SRAM," IEEE Transactions on Very Large Scale Integration (VLSI) Systems, vol. 11, No. 4, pp. 701-715 (Aug. 2003).
Guo et al., "FinFET-Based SRAM Design," ISLPED (Aug. 8-10, 2005).
Yamaoka et al., "Low Power SRAM Menu for SOC Application Using Yin-Yang-Feedback Memory Cell Technology," Symposium on VLSI Circuits Digest of Technical Papers, pp. 288-291 (2004).
Kuriyama et al., "An Asymmetric Memory Cell using a C-IFT for ULSO SRAMs," Symposium on VLSI Technology Digest of Technical Papers, pp. 38-39 (1992).

(Continued)

*Primary Examiner* — Pho M Luu
(74) *Attorney, Agent, or Firm* — Ryan, Mason & Lewis, LLP

(57) ABSTRACT

Asymmetrical SRAM cells are improved by providing one or more of improved read stability and improved write performance and margin. A first inverter and a second inverter are cross-coupled and configured for selective coupling to true and complementary bit lines under control of read and write word lines. The first inverter is formed by a first, n-type, FET (NFET) and a second, p-type, FET (PFET). Process and/or technology approaches can be employed to adjust the relative strength of the FETS to obtain, for example, read margin, write margin, and/or write performance improvements.

24 Claims, 9 Drawing Sheets

OTHER PUBLICATIONS

Itabashi et al., "A Split Wordline Cell for 16Mb SRAM Using Polysilicon Sidewall Contacts," IEEE, IEDM 91 (1991).

"Taurus-Medici: Industry-standard device simulation tool," Synopsys Data Sheet (2003).

Shang et al., "Mobility and CMOS Devices/Circuits on sub-10nm (110) Ultra Thin Body SOI," Symposium on VLSI Technology Digest of Technical Papers, pp. 78-79 (2005).

Kim et al., "Performance assessment of scaled strained-Si channel-on-insulator (SSOI) CMOS," Solid-State Electronics 48, pp. 239-243 (2004).

Takeda et al., "A Read-Stantic-Noise-Margin-Free SRAM Cell for Low-$V_{dd}$ and High-Speed Applications," IEEE International Solid-State Circuits Conference, pp. 478-479, 611 (2005).

* cited by examiner

ASYMMETRICAL MEMORY CELLS AND MEMORIES USING THE CELLS

CROSS-REFERENCE TO RELATED APPLICATIONS

This application is a continuation, under 37 CFR 1.53(b), of Ser. No. 11/392,071, now co-assigned U.S. Pat. No. 7,362,606 of inventors Chuang et al., and claims the benefit thereof, said U.S. Pat. No. 7,362,606 having been filed on Mar. 29, 2006, and entitled "Asymmetrical Memory Cells And Memories Using The Cells." The complete disclosure of the aforesaid U.S. Pat. No. 7,362,606 is expressly incorporated herein by reference in its entirety for all purposes.

STATEMENT REGARDING FEDERALLY SPONSORED RESEARCH OR DEVELOPMENT

This invention was made with Government support under contract number NBCH 3039004 awarded by the Defense Advanced Research Projects Agency (DARPA). The government has certain rights in this invention.

FIELD OF THE INVENTION

The present invention generally relates to electronic circuitry and, more particularly, to electronic memory circuits.

BACKGROUND OF THE INVENTION

Due to the increased portion of Static Random Access Memory (SRAM) arrays in the total chip area of modern chips, device dimensions in SRAM must be continuously scaled. With shorter device channels and narrower widths, intrinsic device fluctuations and random mismatches among adjacent devices are significantly increased due to, e.g., random dopant fluctuations, short-channel effects, and narrow-width effects; thus, the stability of SRAM degrades with technology scaling.

The well-known conventional six transistor SRAM is described, e.g., in Hodges & Jackson's textbook "Analysis and Design of Integrated Circuits," 2d edition, at pages 364-68 (New York, McGraw Hill, 1988). The conventional SRAM has its worst stability during the READ mode because the voltage at the storage node having a "zero" logic value rises during the READ cycle. If this increased node voltage is larger than the trip voltage of the inverter, the stored logic values will be flipped and data will be lost.

U.S. Pat. No. 6,198,656 to Zhang discloses an asymmetric memory cell for single-ended sensing. An apparatus including an asymmetrical memory cell having a first inverter and a second inverter is provided. The first inverter is larger than the second inverter.

U.S. Pat. No. 5,673,230 to Kuriyama discloses a semiconductor memory device capable of operating at high speed and stably even under low power supply voltage. A memory cell includes a read/write word line R/WL1 driving an access transistor Q1 in read and write operations and a write word line WL1 driving an access transistor Q2 in the write operation. In the write operation, both access transistors Q1 and Q2 are driven, and storage information is written in the memory cell by a bit line and a complementary bit line having potentials complementary to each other. On the other hand, in the read operation, only access transistor Q1 is rendered conductive, and storage information is read out through the bit line. Since access transistor Q2 is rendered nonconductive, a P type TFT transistor and an N type transistor operate as a complementary metal oxide semiconductor (CMOS) type inverter having a large voltage gain. Therefore, a sufficient operating margin is secured even in the read operation.

K. Takeda et al. have proposed "A Read-Static-Noise-Margin-Free SRAM Cell for Low-$V_{dd}$ and High-Speed Applications in 65 nm CMOS Technology with Integrated Column-Based Dynamic Power Supply" as set forth in *Dig. Tech. Papers, ISSCC*, pp. 478-479, February 2005. The proposed cell employs seven transistors. The additional transistor and a required extra word line increase the total cell area and the proposed cell also presents additional design considerations.

Thus, conventional symmetrical 6-T cells may be unstable when scaled to small sizes, and while the so-called asymmetrical SRAM cell can achieve an improved static noise margin (SNM) as compared to a conventional symmetrical SRAM cell, there are practical limits, due to device size considerations, to obtain further improvement in the SNM. The 7-T approach has limitations as set forth in the preceding paragraph.

It would be desirable to overcome the limitations in previous approaches.

SUMMARY OF THE INVENTION

Principles of the present invention provide techniques for asymmetrical SRAM cells which can be improved, for example, by providing one or more of improved read stability and improved write performance and margin. In one exemplary embodiment, applicable to a variety of technologies, a memory cell for interconnection with true and complementary bit lines and read and write word lines includes a plurality of field effect transistors (FETS). The FETS form a first inverter and a second inverter cross-coupled to the first inverter. The first and second inverters are configured for selective coupling to the true and complementary bit lines under control of the read and write word lines. The first inverter is formed by first and second ones of the FETS, and the first FET is an n-type FET (NFET) and has an oxide layer with a thickness and a drive current. The second FET is a p-type FET (PFET) and has an oxide layer with a thickness.

The thickness of the oxide layer of the first FET is thicker than the thickness of the oxide layer of the second FET, so as to make the drive current of the first FET lower than a drive current of a comparable NFET having an oxide layer thickness comparable to the thickness of the oxide layer of the second FET.

In another exemplary embodiment, applicable, e.g., to strained silicon technology, each of a plurality of FETS in a memory cell similar in basic configuration to that first described above in this summary section has a Germanium content that is at least zero, and on-state current of at least one of the FETS is adjusted via selecting the Germanium content to be different than that of another of the FETS.

In yet another exemplary embodiment, applicable, e.g., to hybrid orientation technology (HOT), each of a plurality of FETS in a memory cell similar in basic configuration to that first described above in this summary section is implemented in HOT. Each of the plurality of FETS has a crystal orientation, and current versus voltage characteristics of at least one of the FETS are adjusted via selecting the crystal orientation to be different than that of another of the FETS.

In still a further exemplary embodiment, applicable, e.g., to metal gate technology, each of a plurality of FETS in a memory cell similar in basic configuration to that first described above in this summary section is implemented in metal gate technology. Each of the plurality of FETS has a gate material. Current versus voltage characteristics of at least one of the FETS are adjusted via selecting the gate material to be different than that of another of the FETS.

In yet a further exemplary embodiment, applicable, e.g., to double gate technology, each of a plurality of FETS in a memory cell similar in basic configuration to that first described above in this summary section is implemented in double gate technology. At least one of the FETS is a double-gate FET having at least one gate material. Current versus voltage characteristics of the at least FET are adjusted via selecting the gate material.

The different techniques discussed herein can also be used in conjunction with device sizing techniques, if desired.

One or more embodiments of the present invention may be realized in the form of an integrated circuit.

These and other objects, features and advantages of the present invention will become apparent from the following detailed description of illustrative embodiments thereof, which is to be read in connection with the accompanying drawings.

DETAILED DESCRIPTION OF PREFERRED EMBODIMENTS

Figure 1:
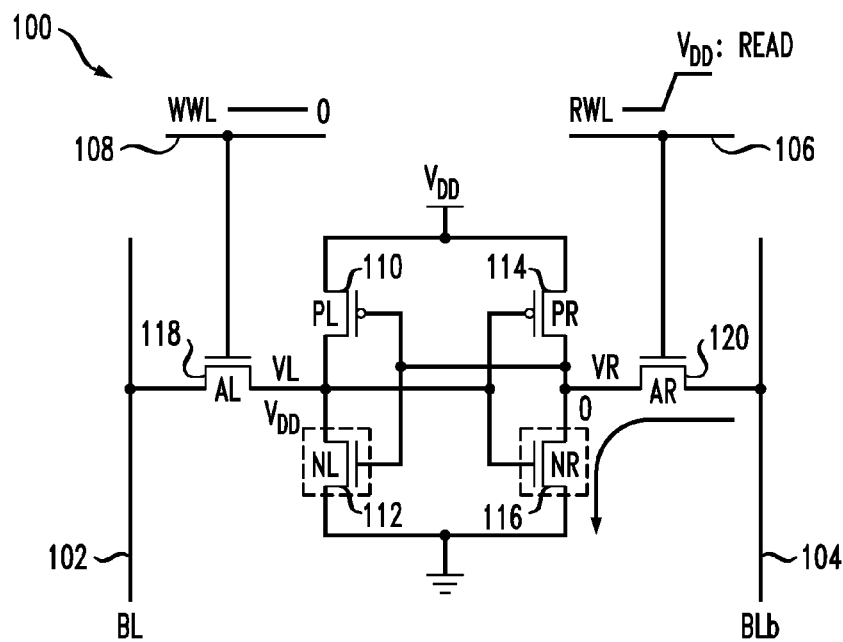
FIG. 1 shows an asymmetrical six-transistor (6T) memory cell not employing techniques of the present invention.

FIG. 1 depicts an asymmetrical SRAM cell not using techniques of the present invention. It will be appreciated that asymmetrical cell 100 can be part of a larger memory circuit having a plurality of bit line structures, such as those formed by true and complementary bit lines 102, 104. Such bit lines are also referred to as "BL" and "BLb." Further, the circuit also includes a plurality of word line structures, such as those formed by read and write word lines 106, 108 (also referred to as "RWL" and "WWL" respectively) that intersect the plurality of bit line structures to form a plurality of cell locations. The cell 100 is asymmetrical, that is, there is not symmetry between the left and right portions of the cell 100.

The cell 100 can be selectively coupled to a corresponding one of the bit line structures formed by true and complementary bit lines 102, 104 under control of a corresponding one of the word line structures formed by read and write word lines 106, 108. Each of the cells can include a first inverter having first and second FETS 110, 112 respectively. Furthermore, each cell can have a second inverter with third and fourth FETS 114, 116 respectively. The second inverter formed by transistors 114, 116 can be cross-coupled to the first inverter formed by transistors 110, 112 to form a storage flip-flop.

The selective coupling can be effected via fifth and sixth FETS (access transistors) 118, 120. First through sixth FETS 110, 112, 114, 116, 118, 120 are also designated, respectively, as PL, NL, PR, NR, AL and AR. In this terminology, "L" refers to left-side, "R" refers to right-side, "P" refers to a P-type transistor, "N" refers to an N-type transistor, and "A" refers to an access transistor.

Figure 2:
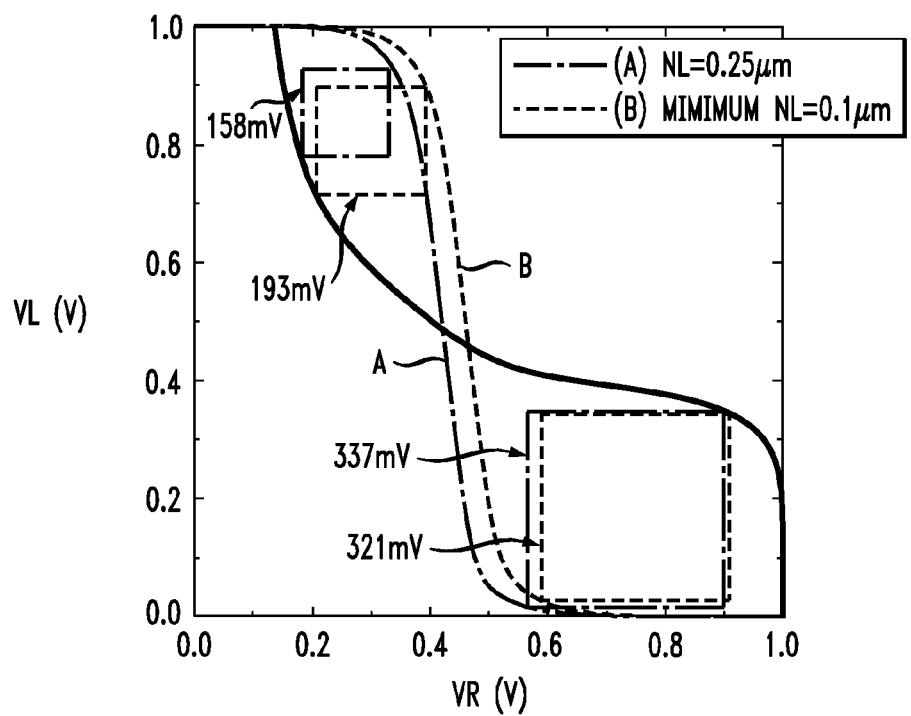
FIG. 2 shows a comparison of predicted static noise margin (SNM) between different asymmetrical cells according to FIG. 1 (using device sizing techniques)

SNM improvement for the cell of FIG. 1, via device width sizing, is limited by the minimum device width offered in a given technology. This is illustrated in FIG. 2, where the MEDICI-predicted SNM for an asymmetrical 6T cell with different device widths for NL in a bulk CMOS technology, with 25 nm effective channel length ($L_{eff}$=25 nm) and 1 nm physical oxide thickness ($t_{ox}$=1 nm), is depicted. The super-steep retrograde channel doping profile is used to suppress short-channel effects. The drift-diffusion model in MEDICI is used to perform mixed-mode device/circuit simulations. The quantum-mechanical correction is considered in the simulation. As shown in FIG. 2, the Read SNM can be improved by conventional sizing. For minimum width (NL=0.1 µm), Read SNM is increased by ~35 mV. However, further improvement cannot be achieved by conventional sizing. While one can increase the width (strength) of PL, it would increase the cell size and degrade the Write performance. The MEDICI program is available from Synopsys Inc., Mountain View, Calif., and can be used to perform 2-D Device Simulation. As of the writing of this patent application, information is available from the following URL: (http://www.synopsys.com/products/mixedsignal/taurus/device_sim_ds.html).

Figure 3:
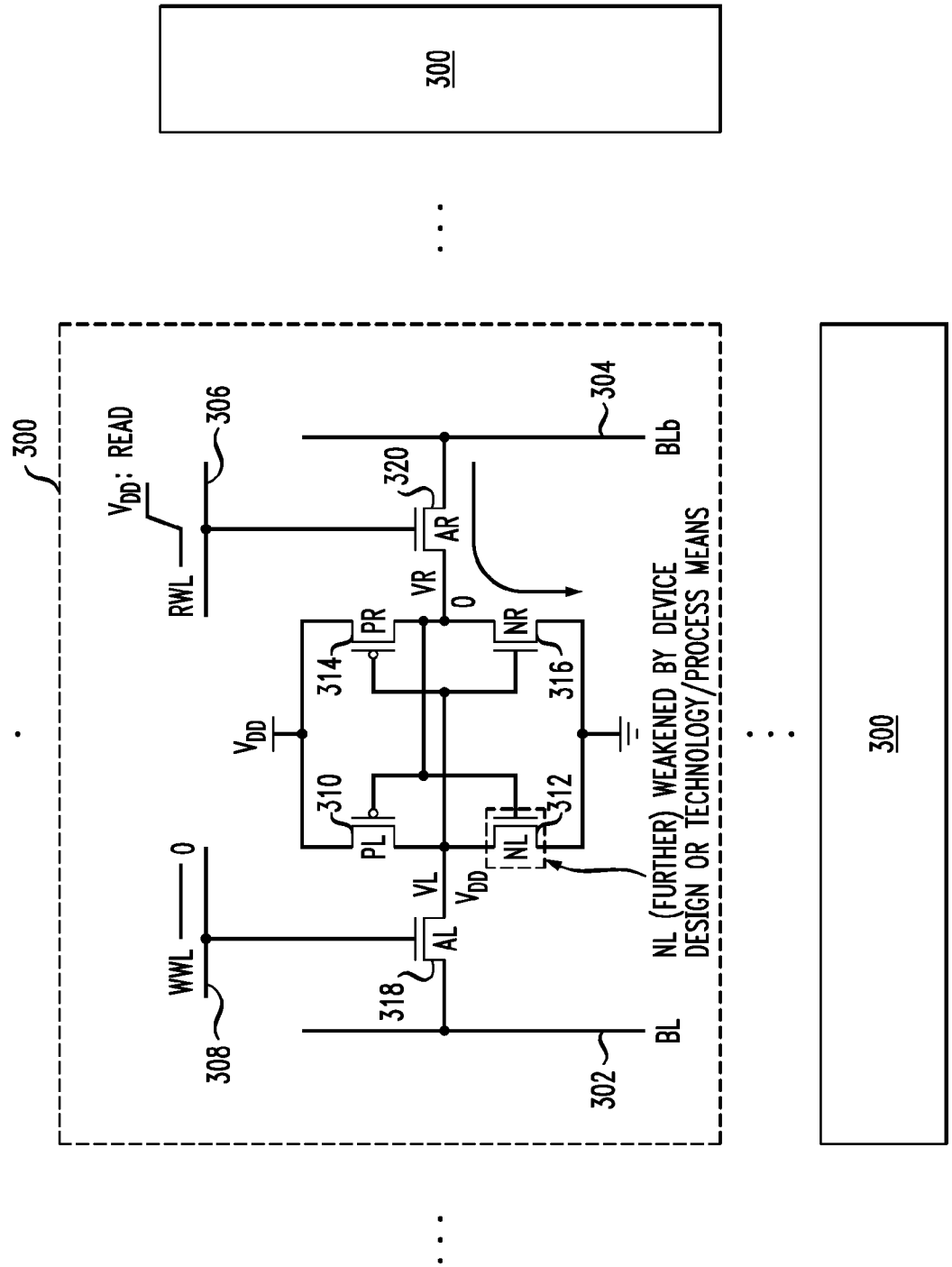
FIG. 3 shows an asymmetrical 6T cell according to one exemplary embodiment of the invention, in a memory using the cell.

Attention should now be given to FIG. 3, which depicts an asymmetrical 6T cell 300 according to one exemplary embodiment of the invention, in a memory using the cell. Elements similar to those described above with respect to FIG. 1 have received the same reference character incremented by 200, and will not be described again except to point out differences from the cell shown in FIG. 3. It will be appreciated that asymmetrical cells 300 are part of the larger memory circuit having a plurality of bit line structures and a plurality of word line structures that intersect the plurality of bit line structures to form a plurality of cell locations. For illustrative convenience, only a single cell 300 is depicted in detail FIG. 1, the other cells being shown in block form. The skilled artisan will appreciate that a memory circuit can be provided, for example, in the form of an integrated circuit, having many such cells, as illustrated by the ellipses. In the exemplary embodiment, each of the cells 300 is asymmetrical, that is, there is not symmetry between the left and right portions of the cell 300. Of course, a circuit could be provided with some cells of the type shown and some cells of a different type, either conventional or according to other embodiments of the present invention. Supply voltage and grounding can be as shown. The FETS can be, for example, metal oxide semiconductor field effect transistors (MOSFETS).

The left-hand n-type transistor NL can be weakened by technology and/or process techniques, either in addition to or in lieu of weakening by device sizing as per FIGS. 1 and 2. Note that "left hand" and "right hand" are used for descriptive convenience and need not refer to physical left and right locations, but rather to the particular functions and interconnections within the cell and to the bit lines and word lines. By way of example, the dimensions could be as follows: AL=AR=0.11 µm, PL=PR=0.1 µm, NR=0.25 µm, NL=0.1 µm.

Figure 4:
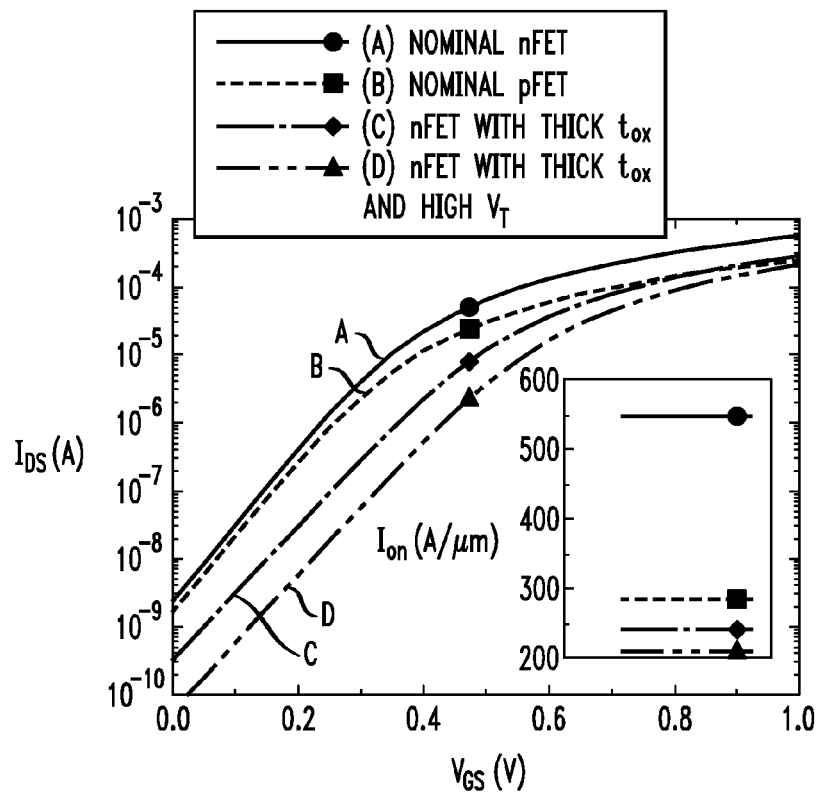
FIG. 4 shows drain-source current versus gate-source voltage curves for a variety of FETS.

Attention should now be given to FIG. 4. To validate the exemplary embodiment, we first show the use of a thick oxide, high $V_T$ device for NL in a 25 nm, $t_{ox}$=1.0 nm bulk CMOS technology. FIG. 4 shows MEDICI-predicted $I_{DS}$-$V_{GS}$ curves at $V_{DS}$=1.0 V for nominal NFET/PFET, thick oxide NFET, and thick oxide high $V_T$ NFET. Predicted $I_{on}$ at $V_{DD}$=1 V as shown in the insert. $I_{on}$ for the nominal NFET is ~2.25× higher than $I_{on}$ for the nominal PFET due to much lower hole mobility. The use of thick oxide and high $V_T$ significantly reduce the current drive of the NFET. Simulation shows 50% thicker oxide ($t_{ox}$=1.5 nm) and high $V_T$ for NFET reduce its $I_{on}$ to a level comparable to, or lower than, the $I_{on}$ of a nominal PFET. As used herein, a value is "comparable" to another value when it is the same as, slightly greater than, or slightly less than the other value.

Figure 5:
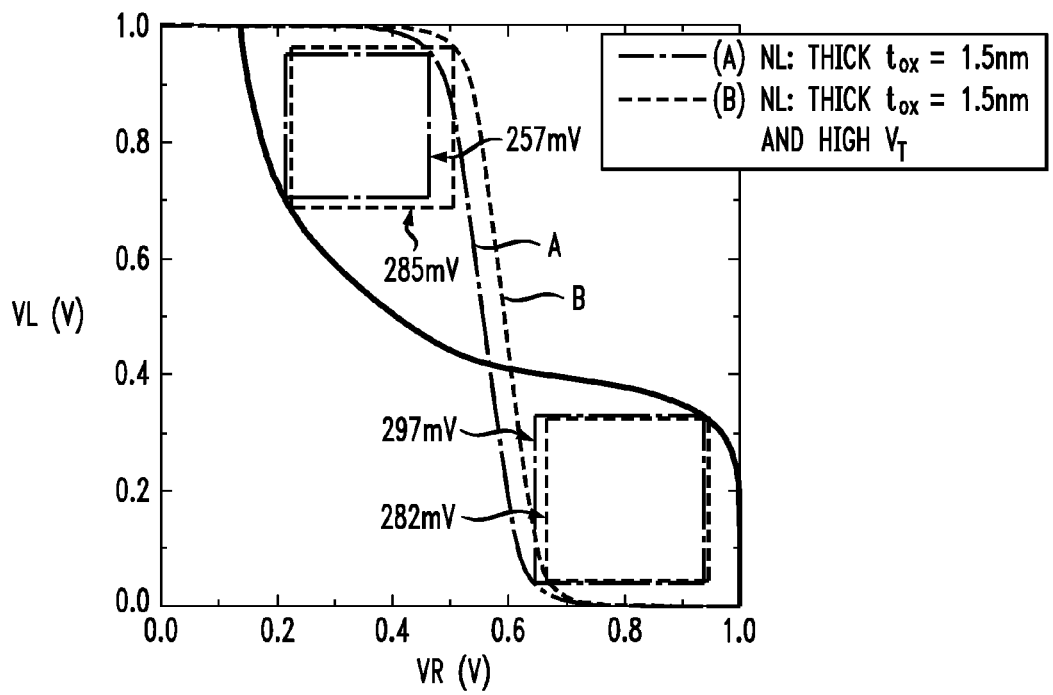
FIG. 5 shows predicted SNM for specific examples of the embodiment of FIG. 3.

FIG. 5 shows MEDICI-predicted results of SNM for the exemplary embodiment with thick $t_{ox}$ and high $V_T$ device for NL as described in FIG. 3. The SNM for the exemplary embodiment is significantly improved by ~125 mV, compared with a conventional symmetrical 6T cell (282 mV vs. 158 mV), and by ~90 mV, compared with the asymmetrical 6T cell of FIG. 1 with minimum NL device width (282 mV vs. 193 mV).

Figure 6:
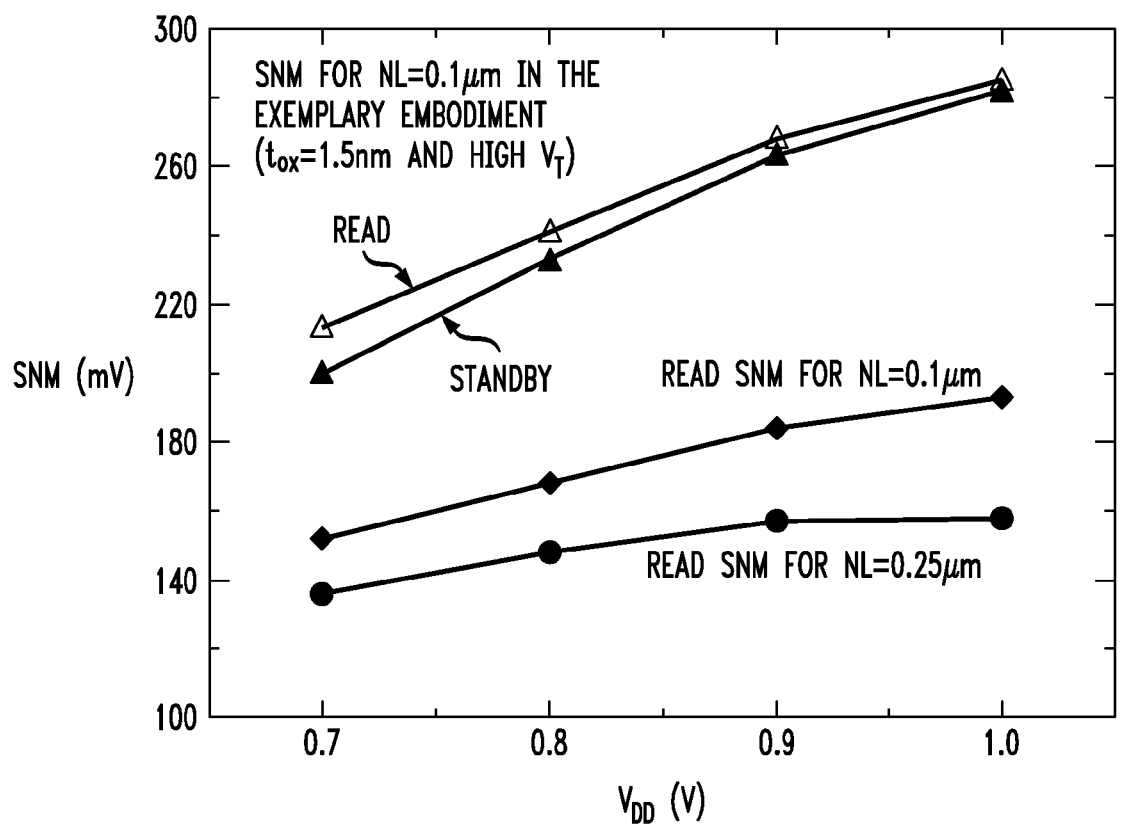
FIG. 6 shows a comparison of predicted SNM versus supply voltage for an example of the embodiment of FIG. 3 versus a symmetrical cell and a cell of FIG. 1.

FIG. 6 shows the $V_{DD}$ dependence of SNM. Even at low $V_{DD}$=0.7 V, a SNM of 200 mV is achieved by the exemplary embodiment, as compared with 136 mV for the conventional 6T cell and 152 mV for an asymmetrical 6T cell with minimum NL. Notice that for the exemplary embodiment, the Read SNM is comparable to the Standby SNM (3-13 mV difference across $V_{DD}$=1.0-0.7 V range). One or more exemplary inventive techniques can trade off standby SNM to improve Read SNM. Read SNM and Standby SNM eventually become comparable for enhanced, preferably optimum, stability. Also notice that SNM of the exemplary embodiment at $V_{DD}$=0.7 V is higher than that of the other two cases at $V_{DD}$=1.0 V. Hence, the exemplary embodiment is much more suitable for low-voltage operations. Furthermore, due to less Drain-induced barrier lowering (DIBL) and short channel effects (SCEs) at lower $V_{DD}$, $V_T$ scatter and leakage and/or dynamic power can be significantly reduced.

Figure 7:
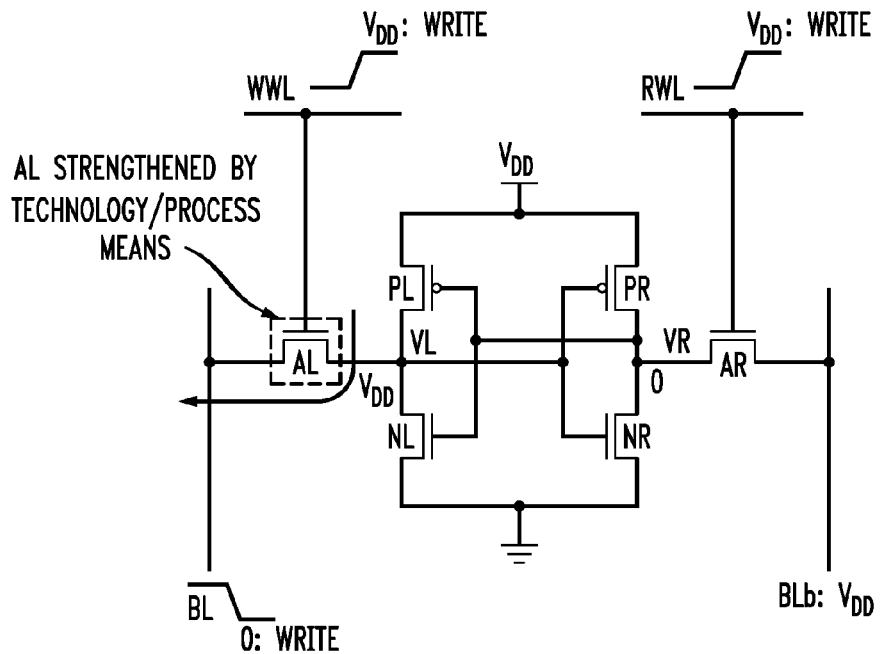
FIG. 7 shows an asymmetrical 6T cell according to another exemplary embodiment of the invention.
Figure 8:
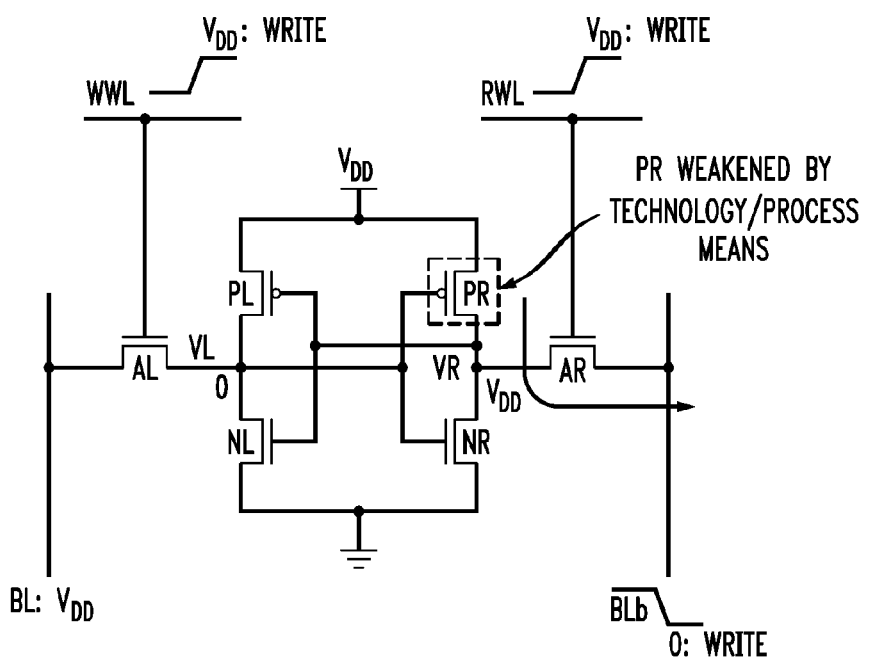
FIG. 8 shows an asymmetrical 6T cell according to yet another exemplary embodiment of the invention.

Thus far, enhancements to performance by adjusting the strength of NL have been described. The Write performance and/or margin can also be improved by selectively strengthening the pass gate NFET AL and/or selectively weakening the cell pull-up PFET PR by similar process and/or technology means. Note that while a single-ended Read process is typically used in an asymmetrical 6T SRAM, a differential Write process is typically employed. As shown in FIG. 7, strengthening of AL helps Write "0" into node VL, while as shown in FIG. 8, weakening of PR helps Write "0" into node VR. It should be pointed out that the Write performance and/or margin improves without degrading the Read and/or Standby stability and Read performance. The exemplary embodiment described in FIG. 3 (weakening of NL) to improve Read stability and/or SNM and the exemplary embodiments described in FIGS. 7 and 8 (strengthening of AL and weakening of PR) are not mutually exclusive. They can be used separately or any 2 or all three can be combined to achieve enhanced, preferably optimum, Read and Write performance and/or margin simultaneously. Note that the cells in FIGS. 7 and 8 can also be part of a larger memory circuit, and inasmuch as the components are labeled they have not been numbered.

The exemplary dimensions in FIGS. 7 and 8 can be AR=0.11 µm, PL=0.1 µm, NR=0.25 µm, NL=0.1 µm. AL can be strengthened to help Write "0" into node VL, as shown in FIG. 7, and PR can be weakened to help Write "0" into node VR, as shown in FIG. 8, by the process and/or technology techniques described hereinabove.

By way of review, we have considered adjusting the thickness of the oxide layer of a transistor in a cell, to control its strength. Such techniques can be employed with a variety of technologies, for example, bulk complementary metal-oxide semiconductor (CMOS) or silicon-on-insulator (SOI), strained-Silicon, HOT, metal gate, and double-gate technologies. In a memory cell of the kind described, an NFET (e.g., NL) that is to have its strength adjusted has an oxide layer with a thickness and a drive current. The thickness of the oxide layer of the first FET is thicker than the thickness of the oxide layer of a second FET, such as PL, so as to make the drive current of the first FET lower than the drive current of a comparable NFET having an oxide layer thickness comparable to the thickness of the oxide layer of the second FET. That is, the drive current of NL is less than if it was made with its oxide thickness the same as PL. This can improve write margin and/or performance, and can be employed in lieu of or in conjunction with weakening based on size. Further, if desired, the channel doping density of the first FET can be greater than the channel doping density of the second FET, so that the first FET can be used with higher threshold voltage than could a comparable NFET not having the greater channel doping density. The drive current ($I_{on}$) of the first FET can be less than or substantially equal to the drive current of the second FET. As used herein, a device is "comparable" to another device when it is configured and dimensioned in a manner similar to the other device, except for any differences as noted.

As noted, NL can be weakened to improve the Read margin. NL is a pull-down transistor. The aforementioned selective coupling is effected, at least in part, via one of the plurality of FETS functioning as an access transistor, AL, for the write word line. The drain of the pull-down transistor can be connected to one of the drain/source terminals of the access transistor.

As noted, in addition to or in lieu of weakening NL, one can strengthen AL to improve Write Margin and Write Performance. The device width of the access transistor for the write word line (AL) is selected to be wider than that of the access transistor for the read word line (AR) so that the drive current of AL is strengthened as compared to AR. Further, one can also weaken PR to improve Write Margin and Write Performance. The oxide layer thickness of the pull-up transistor (PR) is thicker than the thickness of the oxide layer of AR, so as to make the drive current of PR lower than a drive current of a comparable FET having an oxide layer thickness comparable to the thickness of the oxide layer of AR, i.e., PR has a thicker oxide layer than AR so PR has a lower drive current than it would if it had the same oxide thickness as AR. Again, weakening NL, strengthening AL, and weakening PR can be used individually or in any combination.

Figure 9:
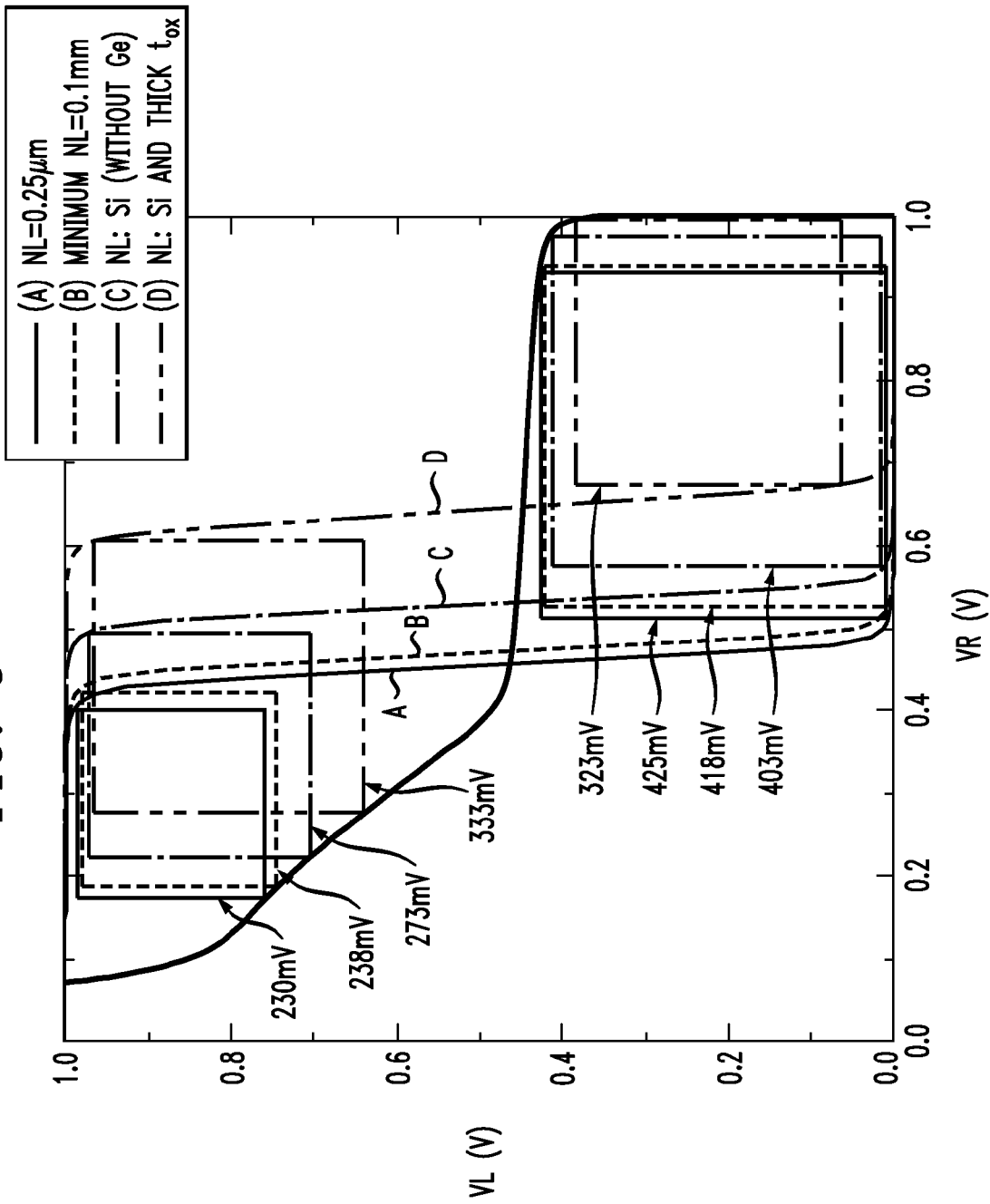
FIG. 9 shows predicted SNM for exemplary application of certain techniques of an aspect of the invention to strained silicon technology.

FIG. 9 shows MEDICI-predicted results of SNM for an alternative embodiment of the invention in a strained-Si technology with skewed weaker NL. Strained Silicon technology is known to the skilled artisan and is discussed, for example, in K. Kim, et al., "Performance Assessment of Scaled Strained-Si Channel-on-Insulator (SSOI) CMOS," *Solid-State Electronics*, pp. 239-243, vol. 48, February 2004. NL is made with a conventional (pure) Si FET, and the other NFETS, including NR, are strained Si devices with 15% Ge. NR has ~200 mV lower $V_T$ and ~40% higher mobility, compared with NL; thus, the asymmetrical cell can be implemented. Note that thick $t_{ox}$ can also be used for NL to further weaken its strength.

In this approach, a memory cell of the kind described is implemented in strained silicon technology. Each of the plurality of FETS has a Germanium content that is greater than or equal to zero. On-state current of at least one of the FETS is adjusted via selecting the Germanium content to be different than that of another of the FETS. In one aspect, on-state current of the first pull-down transistor (NL) is weakened as compared to that of the second pull-down transistor (NR) via selecting the Germanium content of the first pull-down transistor to be less than that of the second pull-down transistor. The first pull-down transistor can have a higher threshold voltage than the second pull-down transistor, due to a larger band gap. The first pull-down transistor can also have a lower carrier mobility and a lower drive current than the second pull-down transistor. It is presently believed that weakening NL or PR can be achieved by lowering Germanium content, while strengthening AL can be most effectively implemented by increasing the device width (size). Thus, the device width of AL can be wider than that of AR. The Germanium content of PR can be lower than that of AR, so as to make the drive current of the pull-up transistor lower than the drive current of the access transistor for the read word line.

Figure 10:
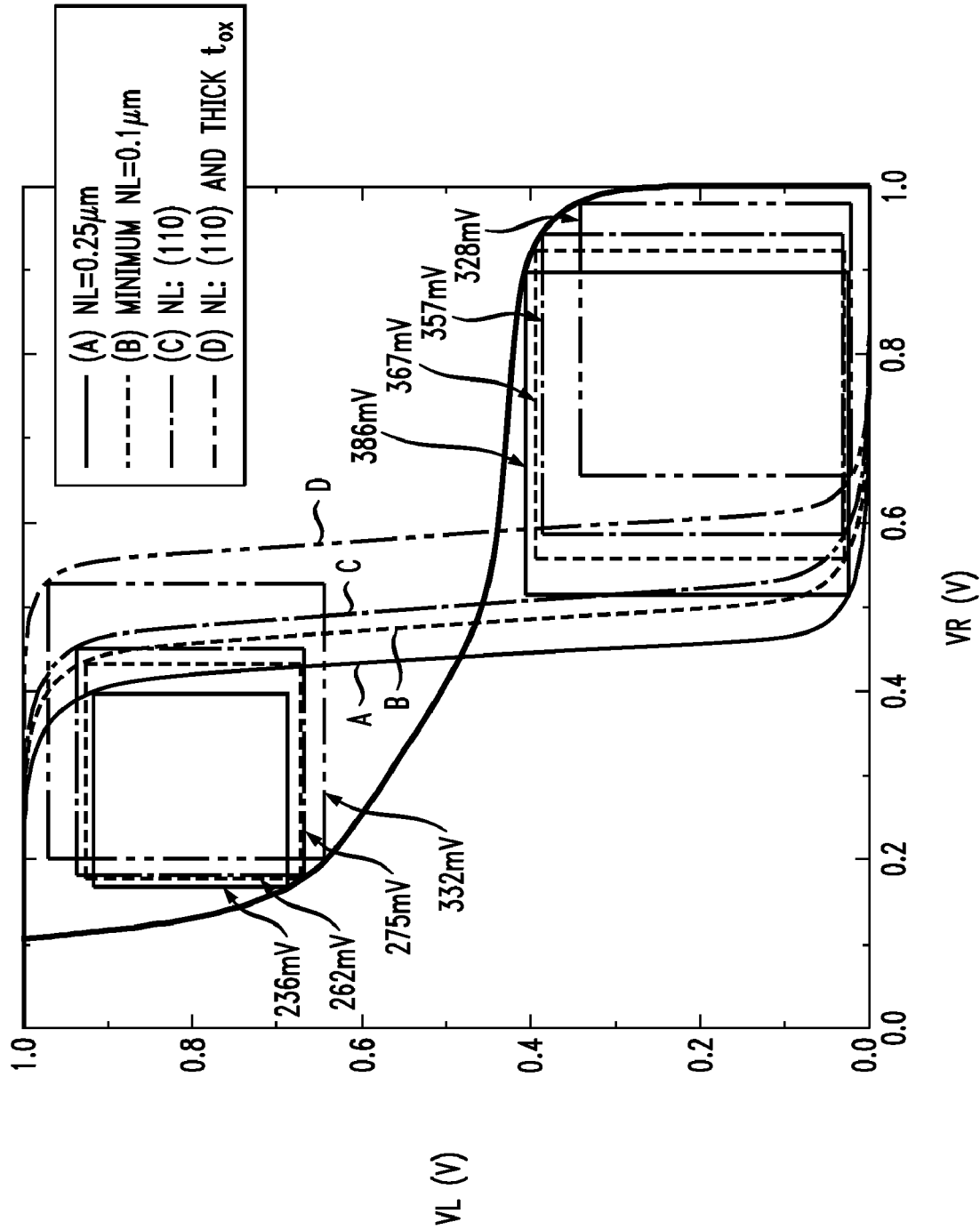
FIG. 10 shows predicted SNM for exemplary application of certain techniques of another aspect of the invention to HOT.

FIG. 10 shows MEDICI-predicted results for SNM for another alternative embodiment of the invention, in HOT with a skewed weaker NL. NL and NR are made with (110) and (100) crystal orientation, respectively, and $I_{on}$ of NL is ~40% lower than $I_{on}$ of NR at $V_{DD}$=1 V. Note that thick $t_{ox}$ can also be used for NL to further weaken its strength.

In this approach, a memory cell of the kind described is implemented in HOT. Each of the plurality of FETS has a crystal orientation, and current versus voltage characteristics of at least one of the FETS are adjusted via selecting the crystal orientation to be different than that of another of the FETS. The crystal orientation can be selected, e.g., for reduced electron mobility. In one aspect, current versus voltage characteristics of NL can be weakened as compared to those of NR via selecting the crystal orientation of the first pull-down transistor to be (110) and that of the second pull-down transistor to be (100). Note that in general, NFET current is highest with (100) and PFET current is highest with (110). One can weaken PR to improve the Write Margin and Write Performance by using (100) crystal orientation for PR and (110) for PL.

Figure 11:
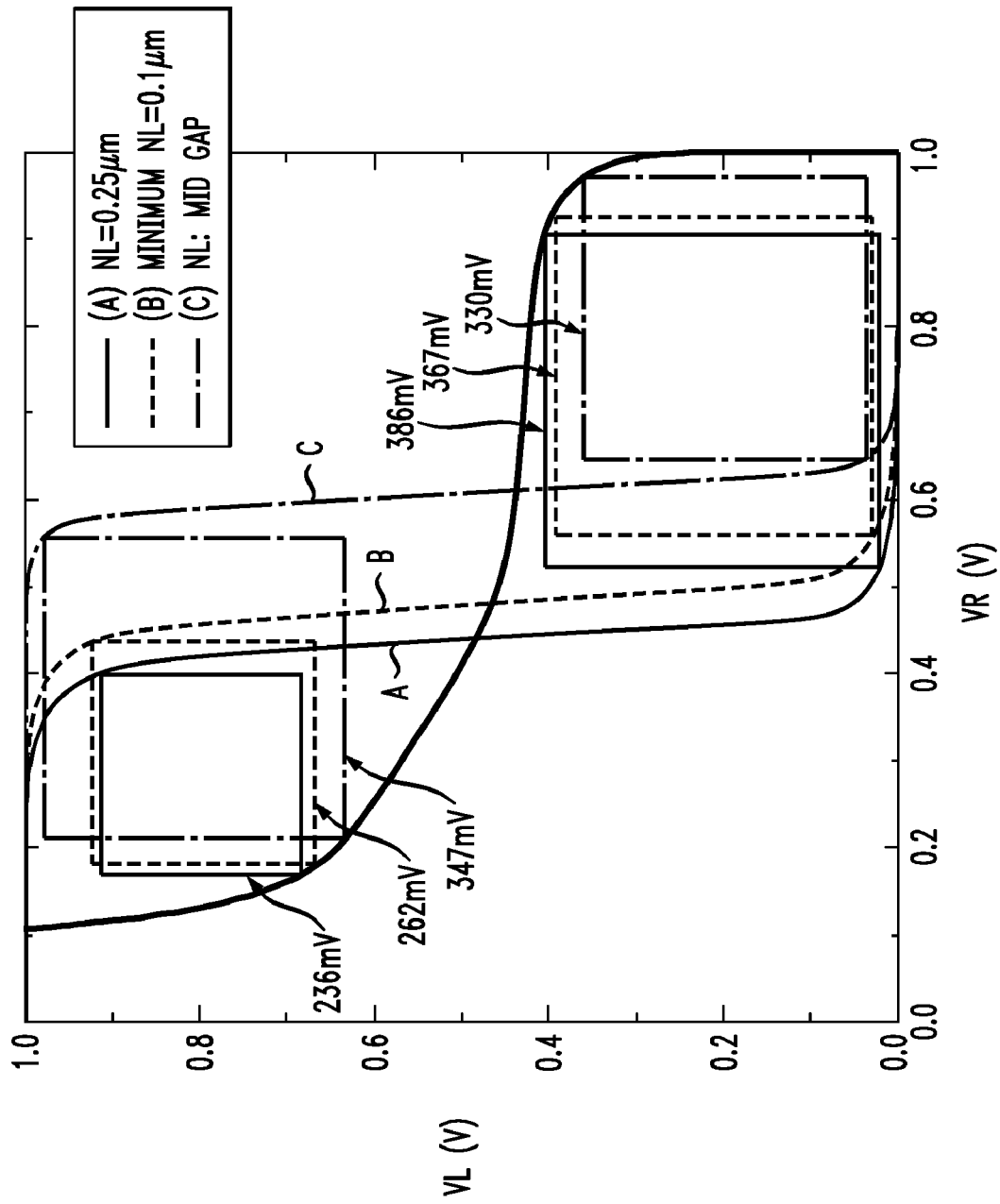
FIG. 11 shows predicted SNM for exemplary application of certain techniques of yet another aspect of the invention to metal gate technology.

FIG. 11 shows MEDICI-predicted results of SNM for still another exemplary embodiment, in a metal gate technology with skewed weaker NL. The gates of NL and NR are made with mid-gap and (conduction) band-edge materials, respectively. $V_T$ of NL is ~0.5 V higher than that of NR, thus $I_{on}$ of NL is reduced to less than half that of NR at $V_{DD}$=1.0 V.

In this approach, a memory cell of the kind described is implemented in metal gate technology. Each of the plurality of FETS has a gate material. Current versus voltage characteristics of at least one of the FETS are adjusted via selecting the gate material to be different than that of another of the FETS. In one aspect, the gate material of at least one of the FETS is a mid-gap material or a quarter-gap gate material and the gate material of another of the FETS is a polysilicon or a band-edge gate material. The threshold voltage of the at least one of the FETS (with mid-gap or quarter-gap gate material) is higher than the threshold voltage of the other of the FETS (with polysilicon or band-edge gate material). The current versus voltage characteristics of NL can be weakened as compared to those of NR via selecting the gate materials. PR can be weakened to improve Write Margin and Write Performance by using a mid-gap material or a quarter-gap material for PR and a polysilicon or a band-edge for PL.

Figure 12:
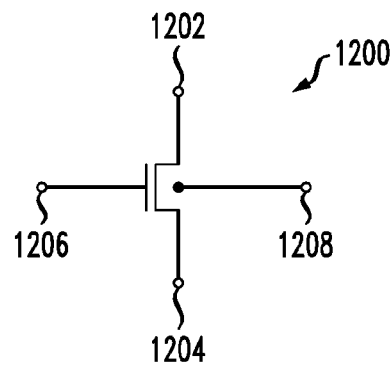
FIG. 12 shows a double-gate FET useful in one or more embodiments of the present invention.

FIG. 12 shows a double-gate FET 1200 useful with one or more embodiments of the invention. An NFET is shown, but the skilled artisan will also appreciate that a PFET can be implemented with a double gate. FET 1200 has first and second drain/source terminals 1202 and 1204, as well as a conventional "front" gate 1206. The double-gate FET also has a back gate 1208. The two gates can be tied together or independent. Further, they can be symmetrical (made of the same material) or can be made of different materials.

Figure 13:
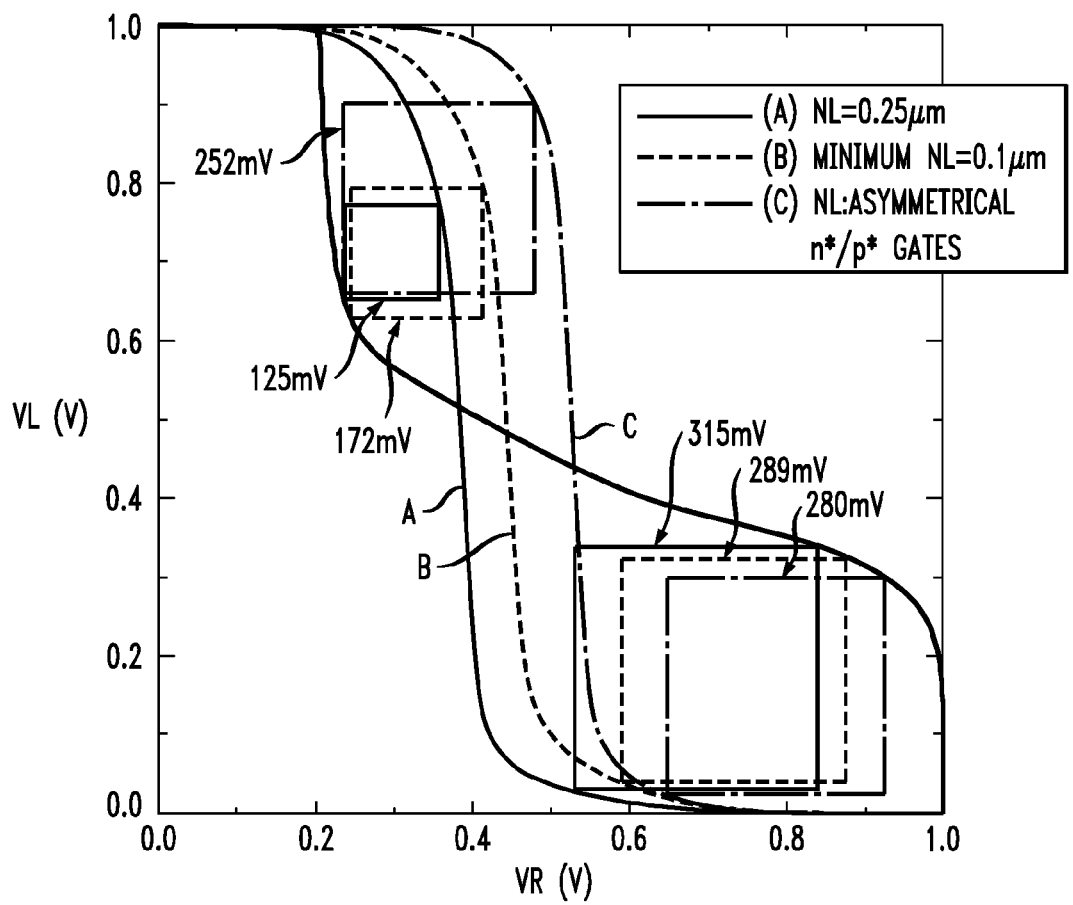
FIG. 13 shows predicted SNM for exemplary application of certain techniques of still another aspect of the invention to double gate technology.

FIG. 13 shows MEDICI-predicted results of SNM for still another alternative embodiment in 25 nm double-gate (DG) technology with skewed weaker NL. The symmetrical DG devices have front and back gate oxide thicknesses $t_{oxf}$=$t_{oxb}$=1 nm, Silicon thickness $t_{Si}$=7 nm, near-mid-gap gates, and undoped bodies. The strength of NL is significantly reduced by using asymmetrical gates. NL is an asymmetrical DG device, while all other devices in this particular example are symmetrical DG devices (as discussed in the next paragraph, in another approach, PR could be an asymmetrical DG device).

In this approach, a memory cell of the kind described is implemented in DG technology. At least one of the FETS is a double-gate FET having at least one gate material. Current versus voltage characteristics of the at least one FET are adjusted via selecting the gate material. In general, NL and/or PR can have their current versus voltage characteristics adjusted via selecting the gate material, and the other FETS besides NL and/or PR can be formed with symmetrical gates. NL and/or PR can have symmetrical gates or asymmetrical gates. In the latter case, one of the asymmetrical gates can be n+ polysilicon and another of the asymmetrical gates can be p+ polysilicon. The remaining FETS would typically have symmetrical gates.

When it is desired to weaken NL, the current versus voltage characteristics of NL can be weakened as compared to those of NR via selecting the gate material. NL can have the aforementioned asymmetrical gates, or it can have symmetrical gates formed from p+ polysilicon. "Symmetrical" gates means that the same type of front and back gate is used for a double-gate device. A symmetrical NFET can employ n+ polysilicon for the front and back gates, or a metal gate material for the front and back gates, while a symmetrical PFET can employ p+ polysilicon for the front and back gates, or a metal gate material for the front and back gates. An asymmetrical NFET can employ n+ polysilicon for the front gate and p+ polysilicon for the back gate, or vice versa, while an asymmetrical PFET can employ p+ polysilicon for the front gate and n+ polysilicon for the back gate, or vice versa.

When it is desired to weaken PR, PL can have symmetrical p+ polysilicon gates and PR can have symmetrical n+ polysilicon gates or asymmetrical gates. One of the asymmetrical gates can be n+ polysilicon and the other can be p+ polysilicon.

It will thus be appreciated that one or more embodiments of the invention can provide techniques for improving the Read stability of memory cells such as asymmetrical 6T SRAM cells through, e.g., enhanced (preferably optimal) cell device design and/or judiciously weakened cell transistor(s), via process and/or technology techniques. Different embodiments may provide one or more of the following advantages:
(1) SNM improvement without adding extra transistors and increasing area;
(2) Substantially similar Read performance with improved SNM;
(3) Substantially similar Writeability, or improved writeability with enhanced (preferably optimal) sizing of a pass gate (access transistor) and/or a weakened cell pull-up PFET by process and/or technology techniques;
(4) Applicable to conventional CMOS technologies including, e.g., bulk Si and SOI, strained Si (or SiGe) technologies, hybrid orientation technologies, metal gate technologies, and double-gate technologies; and
(5) More scalable for low voltage (hence low power) operation.

One or more embodiments can be used to improve SNM in, e.g., an asymmetrical 6T SRAM without degrading Read/Write performance, leakage and/or dynamic power, and area and/or density. Inventive techniques can improve the Read stability and/or SNM of an asymmetrical SRAM cell based on enhanced (preferably optimal) device design and/or judicious placement of a weakened NL cell transistor. One can weaken the strength of NL through device design and technology and/or process means beyond that achievable by conventional device sizing. Among the techniques are, by way of example and not limitation:
(1) using a thick-oxide, high-$V_T$ (high doping) transistor for NL;
(2) For strained-Si technology, asymmetrical strength of two pull-down NFETS (NL and NR) can be achieved by controlling Ge content. A skewed weaker NL can be made by lowering Ge content or using pure Si. This NFET (NL) with lower Ge content has significantly higher $V_T$ due to larger band gap, compared with other NFETS including NR with higher Ge content. NL also has lower carrier mobility, thereby reducing its drive current, compared with NR;
(3) For hybrid orientation technology, a skewed weaker NL can be made with (110) crystal orientation to reduce its electron mobility, while NR is made with conventional (100) orientation;
(4) For metal gate technology, a skewed weaker NL can be made with mid-gap gate material to increase its $V_T$, while NR is made with band-edge gate material to achieve regular/low-$V_T$;
(5) For double-gate technology, a skewed weaker NL can be made by p+ gates or asymmetrical n+/p+ gates, while all other devices including NR are made with symmetrical gates.

These methods can improve, enhance, and potentially maximize the SNM of an asymmetrical SRAM cell without significantly degrading Read/Write performance, leakage and/or dynamic power, and area and/or density. A Read SNM comparable to the standby SNM can be achieved. The inventive techniques, in some embodiments, may also be more scalable for low voltage operations. Techniques disclosed herein can be used alone or in any suitable combination, and can be appropriately combined with other techniques, such as device sizing. Weakening NL, strengthening AL, and weakening PR can be employed separately or in any desirable combination according to the teachings herein.

Memory cells according to one more aspects of the present invention may be formed into memory circuits, which may be realized as integrated circuits; thus, at least a portion of the techniques of one or more aspects or embodiments of the present invention described herein may be implemented in an integrated circuit. In forming integrated circuits, a plurality of identical die are typically fabricated in a repeated pattern on a surface of a semiconductor wafer. Each die can include one or more of the cells described herein, and may include other structures or circuits, or other types of cells. The individual die are cut or diced from the wafer, then packaged as an integrated circuit. A person of skill in the art will know how to dice wafers and package die to produce integrated circuits. Integrated circuits so manufactured are considered part of the present invention. Circuits including cells as described above can be part of the design for an integrated circuit chip. The chip design can be created, for example, in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design can then be converted into an appropriate format such as, for example, Graphic Design System 11 (GDSH), for the fabrication of photolithographic masks, which typically include multiple copies of the chip design in question that are to be formed on a wafer. The photolithographic masks can be utilized to define areas of the wafer (and/or the layers thereon) to be etched or otherwise processed.

Resulting integrated circuit chips can be distributed by the fabricator in raw wafer form (that is, as a single wafer that has multiple unpackaged chips), as a bare die or in a packaged form. In the latter case, the chip can be mounted in a single chip package (such as a plastic carrier, with leads that are affixed to a mother board or other higher level carrier) or in a multi-chip package (such as a ceramic carrier that has either or both surface interconnections or buried interconnections). In any case, the chip may then be integrated with other chips, discrete circuit elements and/or other signal processing devices as part of either (a) an intermediate product, such as a mother board, or (b) an end product. The end product can be any product that includes integrated circuit chips, ranging from toys and other low-end applications to advanced computer products having a display, a keyboard or other input device, and a central processor.

It will be appreciated and should be understood that the exemplary embodiments of the invention described above can be implemented in a number of different fashions. Given the teachings of the invention provided herein, one of ordinary skill in the related art will be able to contemplate other implementations of the invention.

Although illustrative embodiments of the present invention have been described herein with reference to the accompanying drawings, it is to be understood that the invention is not limited to those precise embodiments, and that various other changes and modifications may be made by one skilled in the art without departing from the scope of spirit of the invention.

What is claimed is:

1. A computer-readable medium encoding an apparatus, the encoded apparatus being a memory cell for interconnection with true and complementary bit lines and read and write word lines, the encoded apparatus comprising:
   a plurality of field effect transistors (FETS), said FETS forming:
      a first inverter; and
      a second inverter cross-coupled to said first inverter, said first and second inverters being configured for selective coupling to the true and complementary bit lines under control of the read and write word lines;

wherein:

said first inverter is formed by first and second ones of said FETS;

said first FET comprises an n-type FET (NFET) and has:
an oxide layer with a thickness; and
a drive current;

said second FET comprises a p-type FET (PFET) and has an oxide layer with a thickness; and said thickness of said oxide layer of said first FET is thicker than said thickness of said oxide layer of said second FET, so as to make said drive current of said first FET lower than a drive current of a comparable NFET having an oxide layer thickness comparable to said thickness of said oxide layer of said second FET.

2. The computer-readable medium as recited in claim 1, wherein:

said first FET has a channel doping density;
said second FET has a channel doping density; and
said channel doping density of said first FET is greater than said channel doping densities of said second FET, so that said first FET can be used with higher threshold voltage than could a comparable NFET not having said greater channel doping density.

3. The computer-readable medium as recited in claim 2, wherein said second FET has a drive current and said drive current of said first FET is one of less than and substantially equal to said drive current of said second FET.

4. The computer-readable medium as recited in claim 3, wherein:

said first FET is a pull-down transistor having a drain; and
said selective coupling is effected, at least in part, via at least one of said plurality of FETS functioning as an access transistor for the write word line, said access transistor having a drain and a source, said drain of said pull-down transistor being connected to one of said drain and said source of said access transistor.

5. The computer-readable medium as recited in claim 4, wherein:

said access transistor for the write word line has a device width;
another one of said plurality of FETS is an access transistor effecting said selective coupling to the read word line and having a device width; and
said drive current of said access transistor effecting said selective coupling to the write word line is strengthened as compared to said access transistor effecting said selective coupling to the read word line via selecting said device width of said access transistor effecting said selective coupling to the write word line to be wider than that of said access transistor effecting said selective coupling to the read word line.

6. The computer-readable medium as recited in claim 4, wherein:

a particular one of said FETS is a pull-up transistor having a pull-up transistor oxide layer thickness, a drain, and a source;
said selective coupling is effected, at least in part, via at least one of said plurality of FETS functioning as an access transistor for the read word line, said access transistor for the read word line having a drain, a source, and an oxide layer with a thickness, one of said drain and said source of said pull-up transistor being connected to one of said drain and said source of said access transistor for the read word line; and said pull-up transistor oxide layer thickness is thicker than said thickness of said oxide layer of said access transistor for the read word line, so as to make said drive current of said pull-up transistor lower than a drive current of a comparable FET having an oxide layer thickness comparable to said thickness of said oxide layer of said access transistor for the read word line.

7. A computer-readable medium encoding an apparatus, the encoded apparatus being a memory cell for interconnection with true and complementary bit lines and read and write word lines, the encoded apparatus comprising:

a plurality of field effect transistors (FETS) implemented in strained silicon technology, said FETS forming:
a first inverter; and
a second inverter cross-coupled to said first inverter, said first and second inverters being configured for selective coupling to the true and complementary bit lines under control of the read and write word lines;

wherein:

each of said plurality of FETS has a Germanium content that is at least zero; and
on-state current of at least one of said FETS is adjusted via selecting said Germanium content to be different than that of another of said FETS.

8. The computer-readable medium as recited in claim 7, wherein:

said at least one of said FETS is a first pull-down transistor having a drain;
at least another one of said FETS is a second pull-down transistor;
said selective coupling is effected, at least in part, via at least one of said plurality of FETS functioning as an access transistor for the write word line, said access transistor having a drain and a source, said drain of said first pull-down transistor being connected to one of said drain and said source of said access transistor; and
said on-state current of said first pull-down transistor is weakened as compared to that of said second pull-down transistor via selecting said Germanium content of said first pull-down transistor to be less than that of said second pull-down transistor.

9. The computer-readable medium as recited in claim 8, wherein said first pull-down transistor has a higher threshold voltage than said second pull-down transistor, due to a larger band gap.

10. The computer-readable medium as recited in claim 8, wherein said first pull-down transistor has a lower carrier mobility and a lower drive current than said second pull-down transistor.

11. The computer-readable medium as recited in claim 8, wherein:

a particular one of said FETS is an access transistor effecting said selective coupling to the write word line and having a device width and a drive current;
another particular one of said FETS is an access transistor effecting said selective coupling to the read word line and having a device width; and
said drive current of said access transistor effecting said selective coupling to the write word line is strengthened as compared to said access transistor effecting said selective coupling to the read word line via selecting said device width of said access transistor effecting said selective coupling to the write word line to be wider than that of said access transistor effecting said selective coupling to the read word line.

12. The computer-readable medium as recited in claim 8, wherein:

a particular one of said FETS is a pull-up transistor having a pull-up transistor Germanium content, a drain, and a source;

said selective coupling is effected, at least in part, via at least one of said plurality of FETS functioning as an access transistor for the read word line, said access transistor having a drain, a source, and a Germanium content, one of said drain and said source of said pull-up transistor being connected to one of said drain and said source of said access transistor for the read word line; and said pull-up transistor Germanium content is lower than said Germanium content of said access transistor for the read word line, so as to make said drive current of said pull-up transistor lower than said drive current of said access transistor for the read word line.

13. A computer-readable medium encoding an apparatus, the encoded apparatus being a memory cell for interconnection with true and complementary bit lines and read and write word lines, the encoded apparatus comprising:
a plurality of field effect transistors (FETS) implemented in hybrid orientation technology (HOT), said FETS forming:
a first inverter; and
a second inverter cross-coupled to said first inverter, said first and second inverters being configured for selective coupling to the true and complementary bit lines under control of the read and write word lines;
wherein:
each of said plurality of FETS has a crystal orientation; and
current versus voltage characteristics of at least one of said FETS are adjusted via selecting said crystal orientation to be different than that of another of said FETS.

14. The computer-readable medium as recited in claim 13, wherein said crystal orientation is selected for reduced electron mobility.

15. The computer-readable medium as recited in claim 14, wherein:
said at least one of said FETS is a first pull-down transistor having a drain;
at least another one of said FETS is a second pull-down transistor;
said selective coupling is effected, at least in part, via at least one of said plurality of FETS functioning as an access transistor for the write word line, said access transistor having a drain and a source, said drain of said first pull-down transistor being connected to one of said drain and said source of said access transistor; and
said current versus voltage characteristics of said first pull-down transistor are weakened as compared to those of said second pull-down transistor via selecting said crystal orientation of said first pull-down transistor to be (110) and than that of said second pull-down transistor to be (100).

16. The computer-readable medium as recited in claim 15, wherein:
a particular one of said FETS is a first pull-up transistor having a drain and a source, said first pull-up transistor being coupled to said first pull-down transistor to form said first inverter;
another particular one of said FETS is a second pull-up transistor having a drain and a source, said second pull-up transistor being coupled to said second pull-down transistor to form said second inverter; and
said crystal orientation of said first pull-up transistor is (110) and said crystal orientation of said second pull-up transistor is (100).

17. A computer-readable medium encoding an apparatus, the encoded apparatus being a memory cell for interconnection with true and complementary bit lines and read and write word lines, the encoded apparatus comprising:
a plurality of field effect transistors (FETS) implemented in metal gate technology, said FETS forming:
a first inverter; and
a second inverter cross-coupled to said first inverter, said first and second inverters being configured for selective coupling to the true and complementary bit lines under control of the read and write word lines;
wherein:
each of said plurality of FETS has a gate material; and
current versus voltage characteristics of at least one of said FETS are adjusted via selecting said gate material to be different than that of another of said FETS.

18. The computer-readable medium as recited in claim 17, wherein:
said gate material of said at least one of said FETS is one of a mid-gap material and a quarter-gap gate material, said at least one of said FETS having a threshold voltage;
said gate material of said another of said FETS is one of a polysilicon and a band-edge gate material, said another of said FETS also having a threshold voltage; and
said threshold voltage of said at least one of said FETS is higher than said threshold voltage of said another of said FETS.

19. The computer-readable medium as recited in claim 18, wherein:
said at least one of said FETS is a first pull-down transistor having a drain;
at least another one of said FETS is a second pull-down transistor;
said selective coupling is effected, at least in part, via at least one of said plurality of FETS functioning as an access transistor for the write word line, said access transistor having a drain and a source, said drain of said first pull-down transistor being connected to one of said drain and said source of said access transistor; and
said current versus voltage characteristics of said first pull-down transistor are weakened as compared to those of said second pull-down transistor via selecting said gate materials.

20. The computer-readable medium as recited in claim 19, wherein:
a particular one of said FETS is a first pull-up transistor having a drain and a source, said first pull-up transistor being coupled to said first pull-down transistor to form said first inverter;
another particular one of said FETS is a second pull-up transistor having a drain and a source, said second pull-up transistor being coupled to said second pull-down transistor to form said second inverter; and
said gate material of said first pull-up transistor is one of a polysilicon and a band-edge and said gate material of said second pull-up transistor is one of a mid-gap material and a quarter-gap material.

21. A computer-readable medium encoding an apparatus, the encoded apparatus being a memory cell for interconnection with true and complementary bit lines and read and write word lines, the encoded apparatus comprising:
a plurality of field effect transistors (FETS) at least one of said FETS being a double-gate FET having at least one gate material, said FETS forming:
a first inverter; and
a second inverter cross-coupled to said first inverter, said first and second inverters being configured for selective coupling to the true and complementary bit lines under control of the read and write word lines;
wherein current versus voltage characteristics of said at least one of said FETS are adjusted via selecting said gate material.

22. The computer-readable medium as recited in claim 21, wherein:
said at least one FET has one of:
symmetrical gates; and
asymmetrical gates, one of said asymmetrical gates being n+polysilicon and another of said asymmetrical gates being p+polysilicon.

23. The computer-readable medium as recited in claim 22, wherein:
said at least one FET is a first pull-down transistor having a drain;
at least another one of said FETS is a second pull-down transistor;
said selective coupling is effected, at least in part, via at least one of said plurality of FETS functioning as an access transistor for the write word line, said access transistor having a drain and a source, said drain of said first pull-down transistor being connected to one of said drain and said source of said access transistor; and
said current versus voltage characteristics of said first pull-down transistor are weakened as compared to those of said second pull-down transistor via selecting said gate material, said first pull-down transistor having one of:
said symmetrical gates, said symmetrical gates being formed from p+polysilicon; and
said asymmetrical gates.

24. The computer-readable medium as recited in claim 23, wherein:
a particular one of said FETS is a first pull-up transistor having a drain and a source, said first pull-up transistor being coupled to said first pull-down transistor to form said first inverter;
another particular one of said FETS is a second pull-up transistor having a drain and a source, said second pull-up transistor being coupled to said second pull-down transistor to form said second inverter; and
said first pull-up transistor has symmetrical p+polysilicon gates and said second pull-up transistor has one of:
symmetrical n+polysilicon gates; and
asymmetrical gates, one of said asymmetrical gates being n+polysilicon and another of said asymmetrical gates being p+polysilicon.

\* \* \* \* \*